United States Patent
Odedra et al.

(10) Patent No.: US 11,802,134 B2
(45) Date of Patent: Oct. 31, 2023

(54) ORGANOMETALLIC COMPOUND AND METHOD

(71) Applicant: SEASTAR CHEMICALS ULC, Sidney (CA)

(72) Inventors: Rajesh Odedra, Altrincham (GB); Cunhai Dong, Victoria (CA); Shaun Cembella, Victoria (CA)

(73) Assignee: SEASTAR CHEMICALS ULC, Sidney (CA)

(*) Notice: Subject to any disclaimer, the term of this patent is extended or adjusted under 35 U.S.C. 154(b) by 1480 days.

(21) Appl. No.: 16/076,208

(22) PCT Filed: Feb. 10, 2017

(86) PCT No.: PCT/CA2017/050158
§ 371 (c)(1),
(2) Date: Aug. 7, 2018

(87) PCT Pub. No.: WO2017/136945
PCT Pub. Date: Aug. 17, 2017

(65) Prior Publication Data
US 2021/0070783 A1    Mar. 11, 2021

(30) Foreign Application Priority Data
Feb. 12, 2016 (CA) ...................... 2920646

(51) Int. Cl.
*C07F 7/00* (2006.01)
*C07F 7/02* (2006.01)
(Continued)

(52) U.S. Cl.
CPC ............ *C07F 7/025* (2013.01); *C23C 16/402* (2013.01); *C23C 16/45525* (2013.01)

(58) Field of Classification Search
None
See application file for complete search history.

(56) References Cited

U.S. PATENT DOCUMENTS

| 3,296,195 A | 1/1967 | Goossens |
| 5,288,518 A | 2/1994 | Homma |

(Continued)

FOREIGN PATENT DOCUMENTS

| CN | 103958731 A | 7/2014 |
| EP | 2 837 634 A1 | 2/2015 |

(Continued)

OTHER PUBLICATIONS

Burton et al "SiO2 Atomic Layer Deposition using Tris(dimethylamino)silane and hydrogen peroxide studied by in Situ Transmission FTIR Spectroscopy" J. Phys. Chem. C 2009, 113, 8249-8257 (Year: 2009).*

(Continued)

*Primary Examiner* — Mandy C Louie
(74) *Attorney, Agent, or Firm* — Faegre Drinker Biddle & Reath LLP

(57) ABSTRACT

A class of organometallic compounds is provided. The compounds correspond in structure to Formula 1 $(A)_x\text{-M-}(OR3)_{4-x}$ wherein: A is selected from the group consisting of —NR1R2, —N(R4)(CH2)nN(R5R6), —N=C(NR4R5)(NR6R7), OCOR1, halo and Y; R1 and R2 are independently selected from the group consisting of H and a cyclic or acyclic alkyl group having from 1 to 8 carbon atoms, with the proviso that at least one of R1 and R2 must be other than H; R4, R5, R6 and R7 are independently selected from the group consisting of H and an acyclic alkyl group having from 1 to 4 carbon atoms; Y is selected from the group consisting of a 3- to 13-membered heterocyclic radical containing at least one nitrogen atom; R3 is a cyclic or acyclic alkyl group having from 1 to 6 carbon atoms; M is selected from the group consisting of Si, Ge, Sn, Ti, Zr and Hf; x is an integer from 1 to 3; and n is an integer from 1 to 4. Compounds of the invention may be useful as precursors (Continued)

ALD of SiO$_2$ using (pyrrolidine)$_2$Si(OMe)$_2$ and O$_3$ carried out showing linear film thickness with number of ALD cycles and flattening of the growth rate with (pyrrolidine)$_2$Si(OMe)$_2$ pulse time in chemical phase deposition processes such as atomic layer deposition (ALD), chemical vapour deposition (CVD), plasma assisted ALD and plasma assisted CVD. Methods of low temperature vapour phase deposition of metal oxide films, such as SiO2 films, are also provided.

15 Claims, 13 Drawing Sheets

(51) Int. Cl.
    *C23C 16/40*     (2006.01)
    *C23C 16/455*    (2006.01)

(56) References Cited

U.S. PATENT DOCUMENTS

| | | | |
|---|---|---|---|
| 5,356,718 | A | 10/1994 | Athey et al. |
| 5,401,305 | A | 3/1995 | Russo et al. |
| 5,599,387 | A | 2/1997 | Neuman et al. |
| 8,278,224 | B1 | 10/2012 | Mui et al. |
| 2005/0260357 | A1* | 11/2005 | Olsen ............ H01L 21/02145 257/E21.267 |
| 2005/0277223 | A1* | 12/2005 | Lee ................ H01L 21/3141 556/51 |
| 2006/0068102 | A1 | 3/2006 | Meiere |
| 2006/0247404 | A1 | 11/2006 | Todd |
| 2007/0281495 | A1 | 12/2007 | Mallick et al. |
| 2014/0227512 | A1 | 8/2014 | Smith et al. |

FOREIGN PATENT DOCUMENTS

| | | | |
|---|---|---|---|
| JP | S61-502716 A | | 11/1986 |
| JP | H05-308071 A | | 11/1993 |
| JP | H05304218 A | * | 11/1993 |
| JP | H06-505695 A | | 6/1994 |
| JP | H06-505957 A | | 7/1994 |
| JP | H06-263482 A | | 9/1994 |
| JP | H07-097411 A | | 4/1995 |
| JP | 09-067379 | | 3/1997 |
| JP | H0967379 A | | 3/1997 |
| JP | 09-134910 A | | 5/1997 |
| JP | 09-278819 | | 10/1997 |
| JP | 11-228647 | | 8/1999 |
| JP | 2001122917 A | | 5/2001 |
| JP | 2005-354076 A | | 12/2005 |
| JP | 2006-028312 A | | 2/2006 |
| JP | 2008-514605 A | | 5/2008 |
| JP | 2010-507259 A | | 3/2010 |
| JP | 2011018718 A | | 1/2011 |
| JP | 2013-527147 A | | 6/2013 |
| JP | 2014-532118 A | | 12/2014 |
| KR | 20110009739 A | | 1/2011 |
| KR | 101308572 B1 | | 9/2013 |
| TW | 200604229 A | | 2/2006 |
| TW | 201014924 A | | 4/2010 |
| TW | 201536946 | * | 9/2015 |
| WO | WO-86/00753 A1 | | 1/1986 |
| WO | WO9312892 A1 | | 7/1993 |
| WO | WO-03/011945 A2 | | 2/2003 |
| WO | WO-2005/082952 A1 | | 9/2005 |
| WO | WO-2009/155507 A1 | | 12/2009 |
| WO | WO-2009/155520 A1 | | 12/2009 |
| WO | WO-2011/156699 A1 | | 12/2011 |
| WO | WO-2012/138332 A1 | | 10/2012 |
| WO | WO-2013/048751 A1 | | 4/2013 |
| WO | WO-2015/022298 A1 | | 2/2015 |

OTHER PUBLICATIONS

Official Letter and Search Report dated Aug. 27, 2020 issued in Taiwan (R.O.C.) patent application No. 106104410; with English-language translation of the Search Report.
Search Report and Written Opinion dated Oct. 29, 2019 issued in Singapore patent application No. 11201806724Y.
Extended European search report dated Sep. 23, 2019 issued in European patent application No. 17749873.0.
International Preliminary Report on Patentability dated May 16, 2018 (PCT/CA2017/050158).
First Japanese Office Action issued in Japanese patent application No. 2018-542759 dated Jan. 19, 2021 and its English-language translation thereof.
Guilment, J., et al., "Spectroscopic study of group IV alkoxides as molecular precursors of metal oxides," Vibrational Spectroscopy 1996, vol. 11, pp. 37-49.
First Chinese Office Action issued in Chinese patent application No. 201780010791.8, dated Oct. 8, 2020 and its English-language translation thereof.
Ikeuchi, Hiroyuki et al., "Study on aminosilane compounds as external electron donors in isospecific propylene polymerization," Journal of Molecular Catalysis A: Chemical 193 (2003), pp. 207-215.
Japanese Decision of Rejection dated Feb. 11, 2022.
Second Written Opinion dated Nov. 5, 2020 issued in Singapore patent application No. 11201806724Y.

* cited by examiner

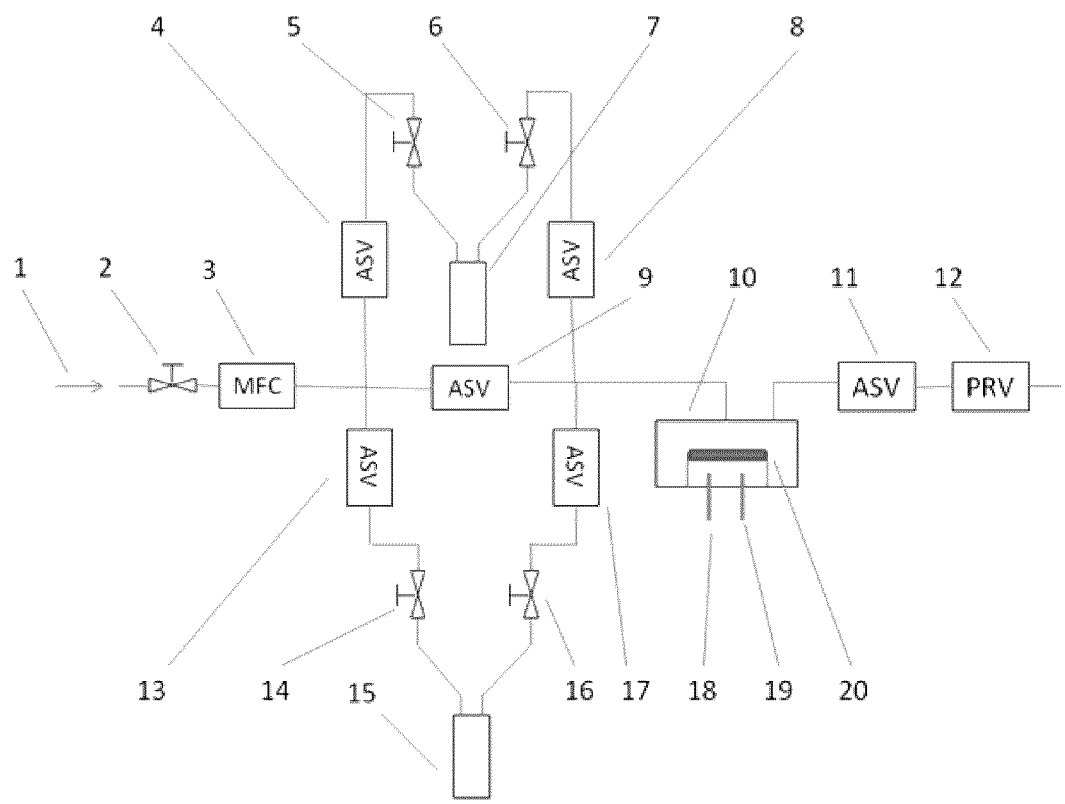
Figure 1. Sketch of ALD system for thin film deposition.
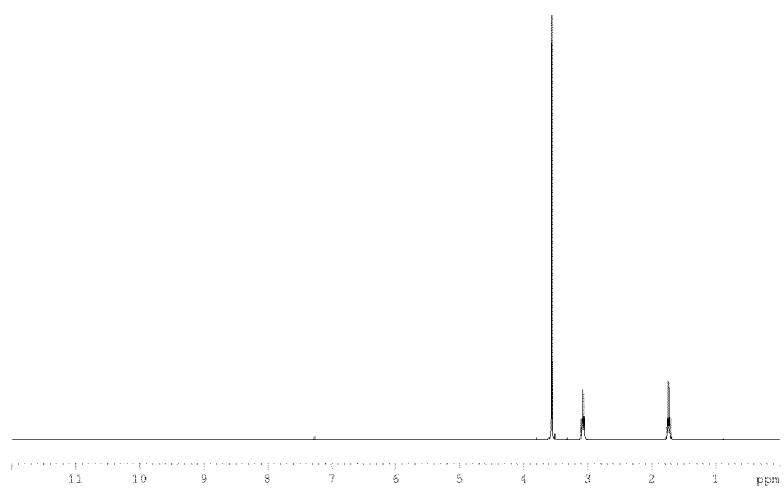
Figure 2. NMR spectrum of (pyrro)Si(OMe)$_3$

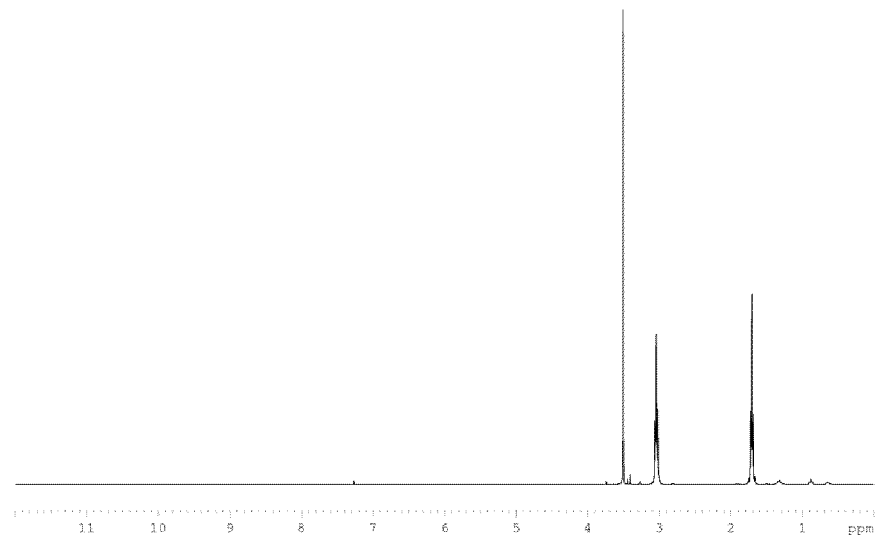
Figure 3. NMR spectrum of (pyrro)$_2$Si(OMe)$_2$
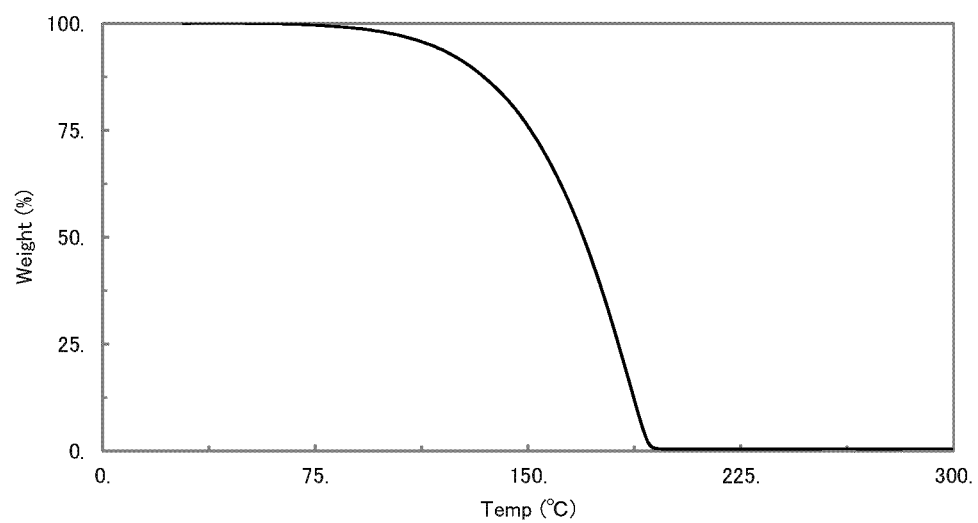
Figure 4. TGA of (pyrro)$_2$Si(OMe)$_2$

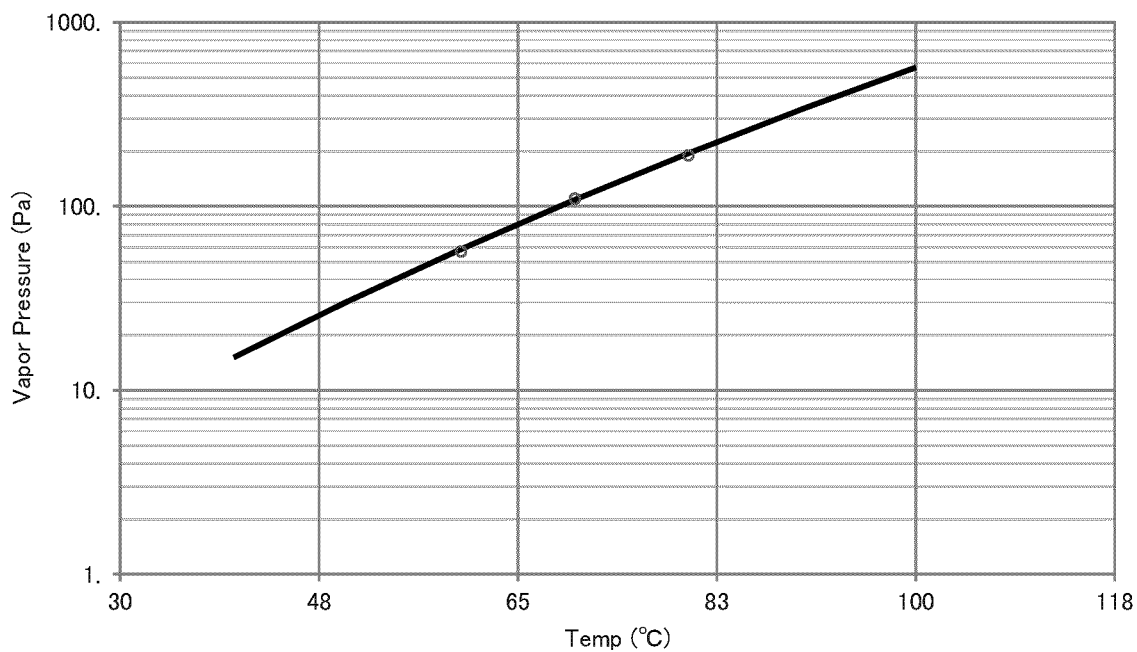
Figure 5. Vapour pressure of (pyrro)$_2$Si(OMe)$_2$
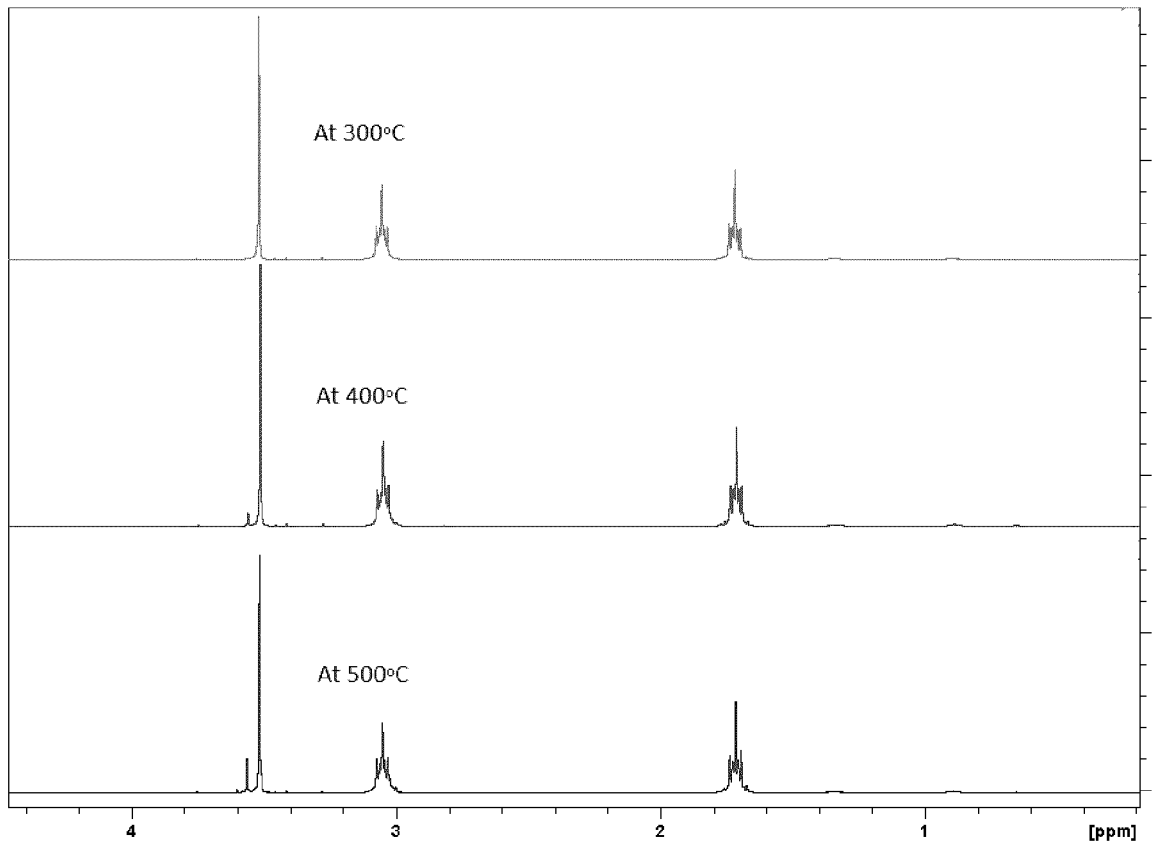
Figure 6. NMR spectra of thermally treated (pyrro)$_2$Si(OMe)$_2$

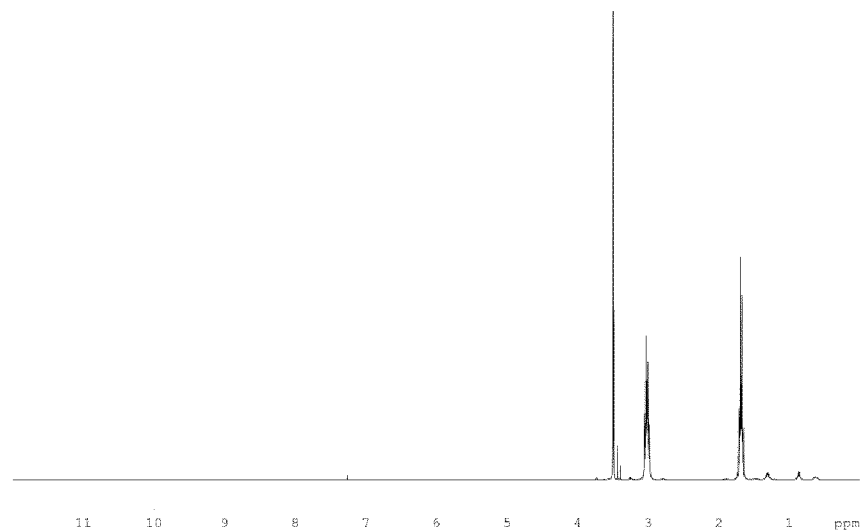
Figure 7. NMR spectrum of (pyrro)₃Si(OMe)
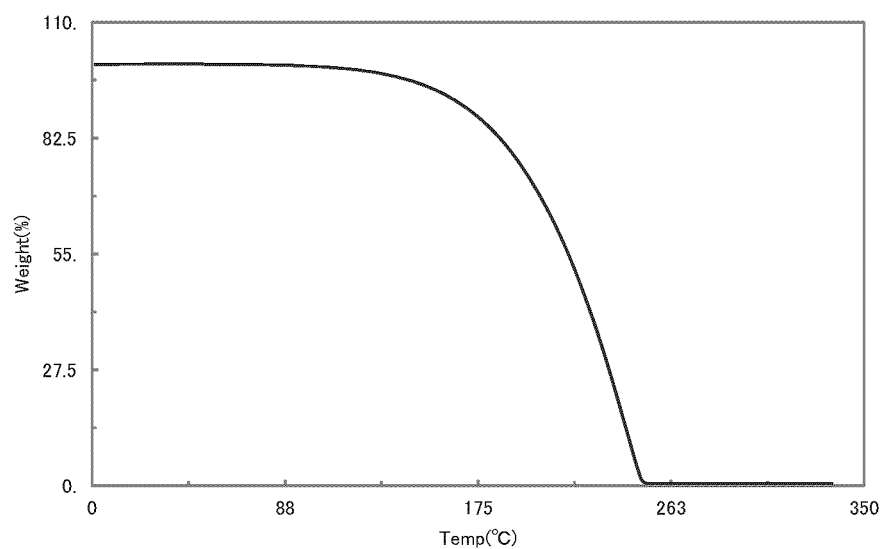
Figure 8. TGA of (pyrro)₃Si(OMe)

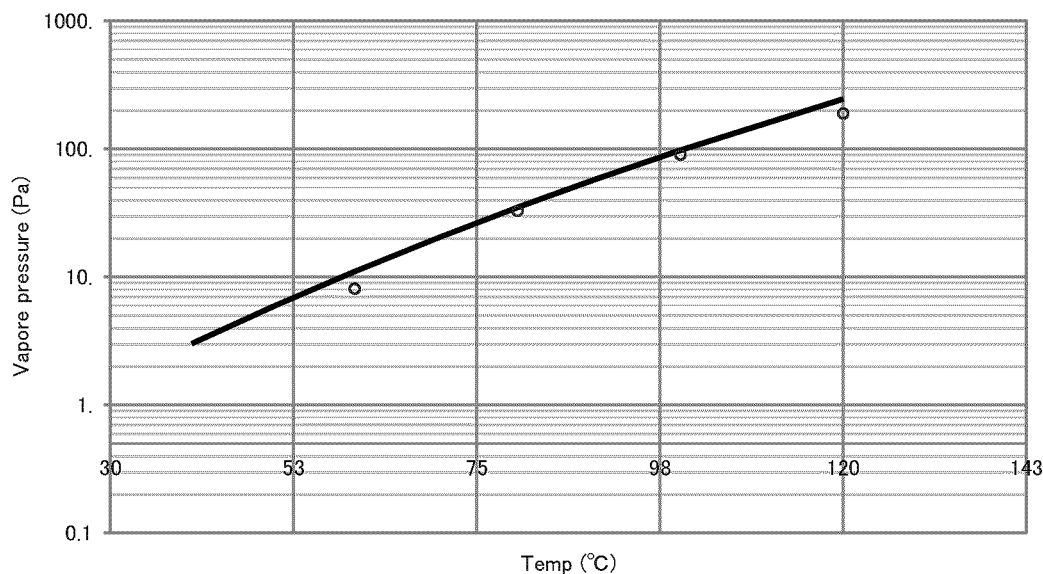
Figure 9. Vapour pressure of (pyrro)₃Si(OMe)
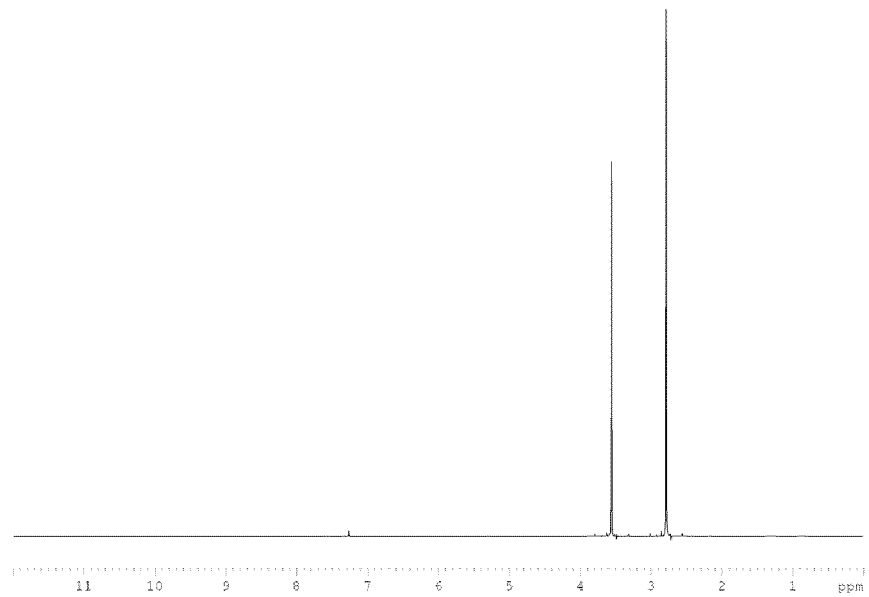
Figure 10. NMR spectrum of (Tetramethylguanidinyl)Si(OMe)₃

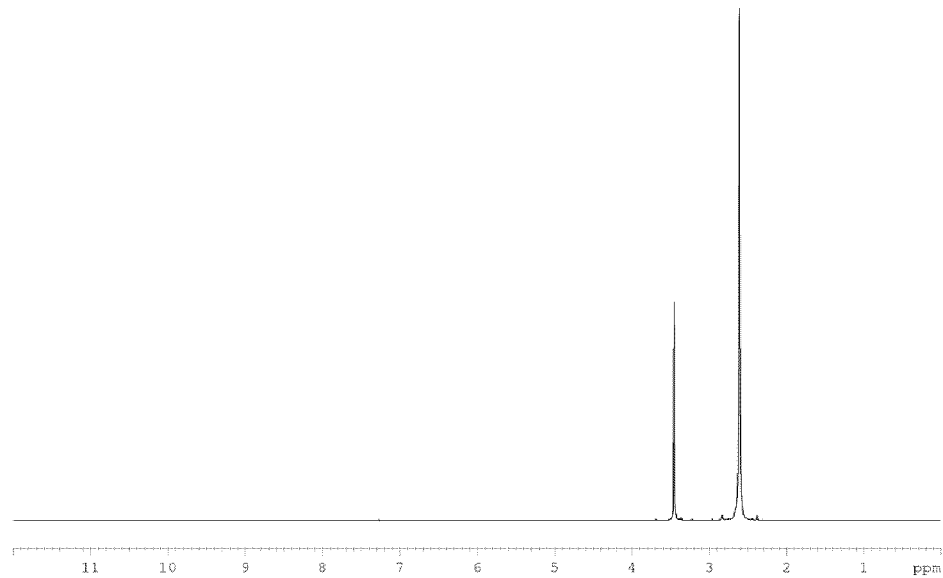
Figure 11. NMR spectrum of (Tetramethylguanidinyl)$_2$Si(OMe)$_2$
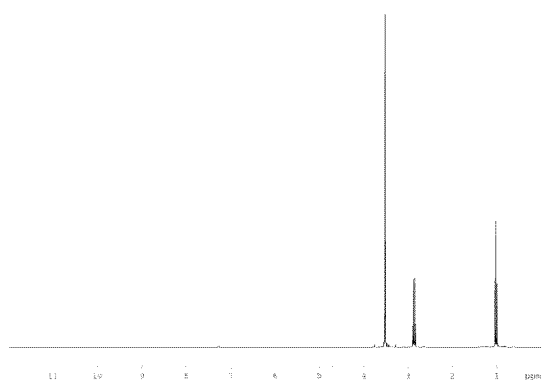
Figure 12. NMR spectrum of (Et$_2$N)Si(OMe)$_3$

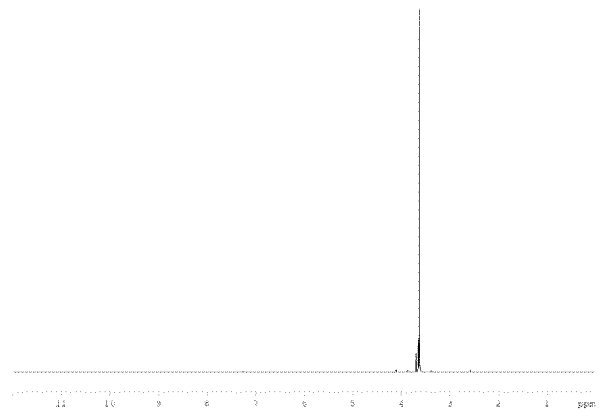
Figure 13. NMR spectrum of ClSi(OMe)₃
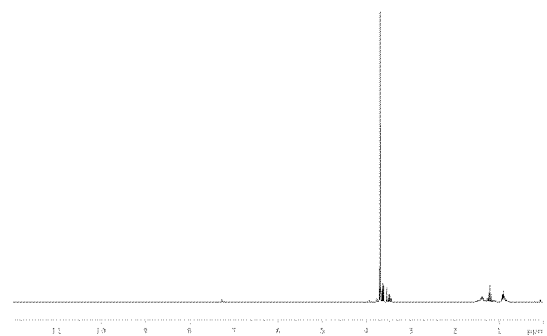
Figure 14. NMR spectrum of Cl₂Si(OMe)₂

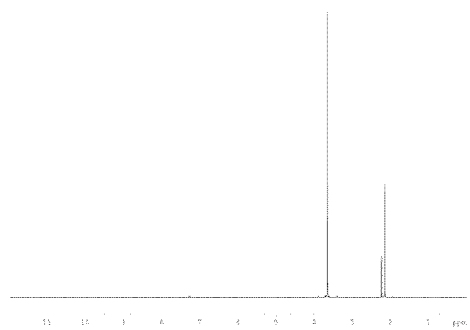
Figure 15. NMR spectrum of (AcO)Si(OMe)$_3$
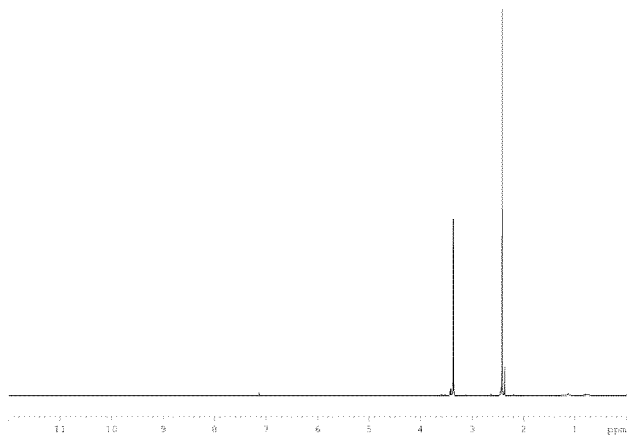
Figure 16. NMR spectrum of (Me$_2$N)$_2$Si(OMe)$_2$

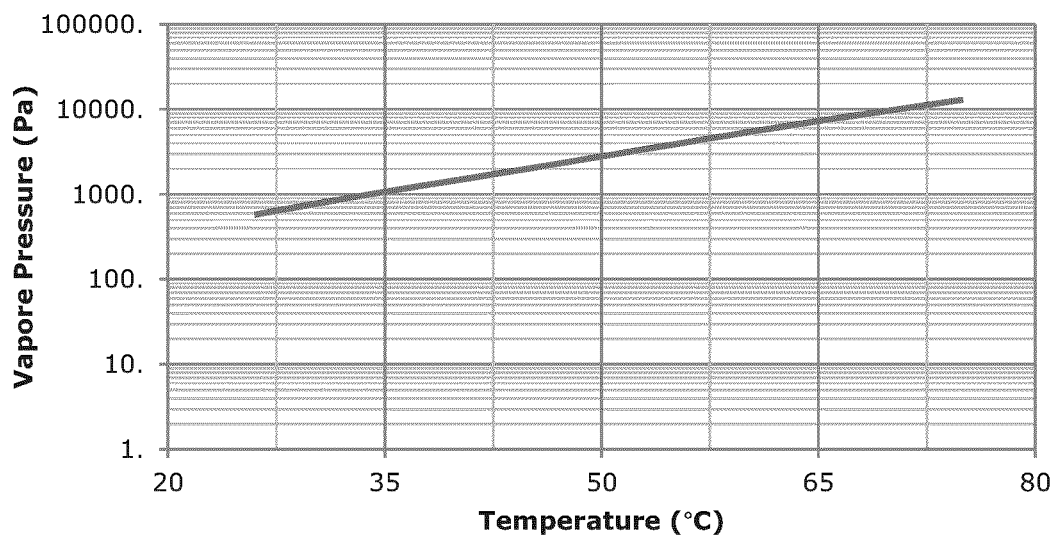
Figure 17. Vapour pressure of (Me$_2$N)$_2$Si(OMe)$_2$
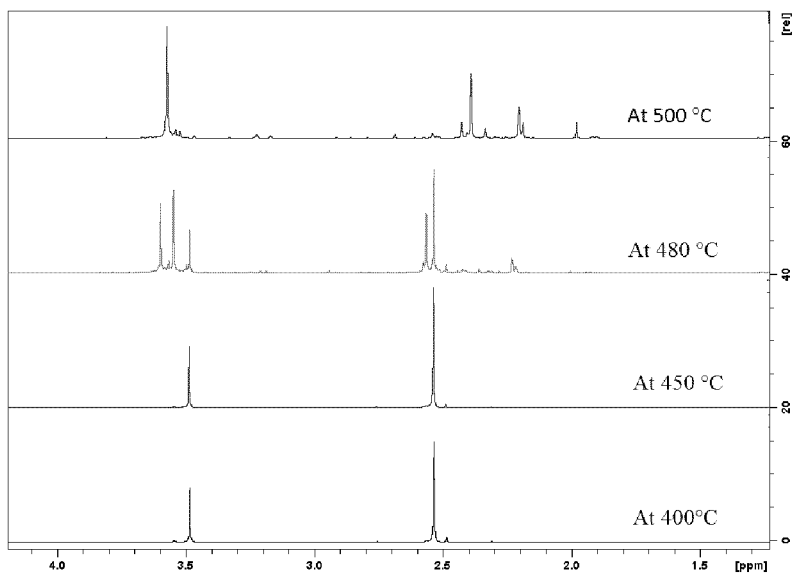
Figure 18. NMR spectra of thermally treated (Me$_2$N)$_2$Si(OMe)$_2$

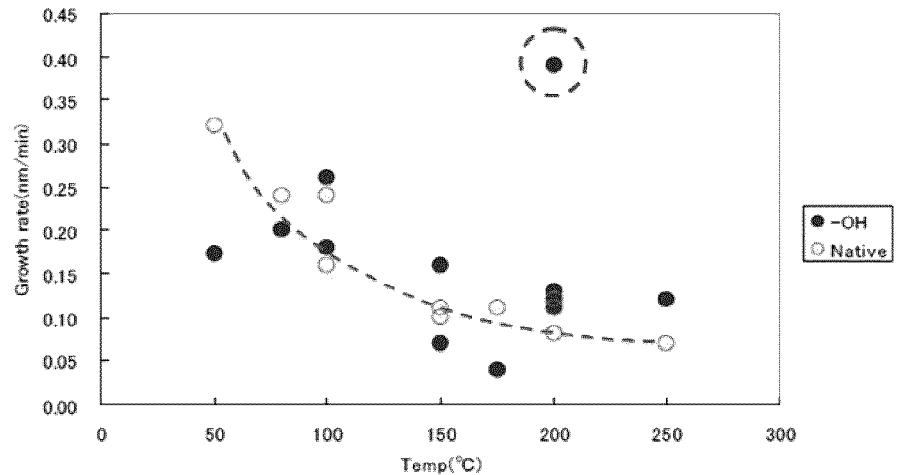
Figure 19. CVD growth rate vs. temperature of of $SiO_2$ using $(pyrrolidine)_2Si(OMe)_2$ and $H_2O$ at 80 Torr.
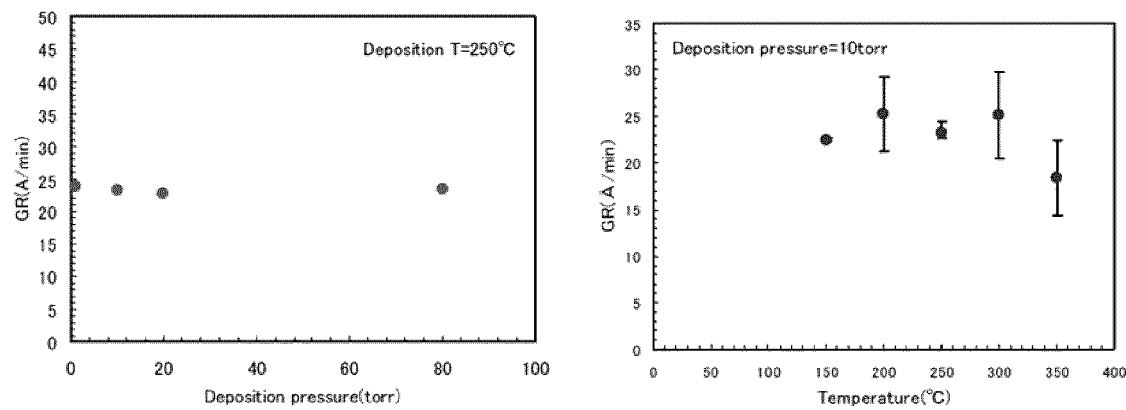
Figure 20. CVD growth rate vs. temperature and pressure of of $SiO_2$ using $(pyrrolidine)_2Si(OMe)_2$ and $O_3$

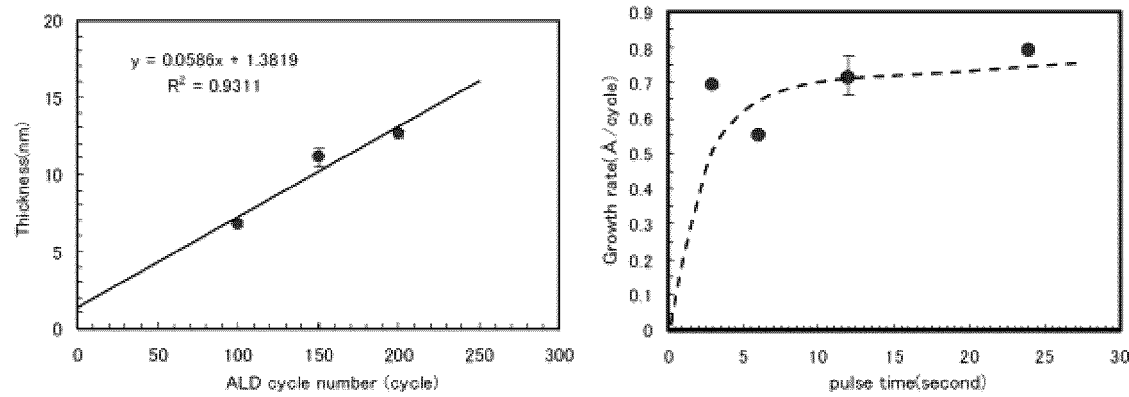
Figure 21. ALD of SiO$_2$ using (pyrrolidine)$_2$Si(OMe)$_2$ and O$_3$ carried out showing linear film thickness with number of ALD cycles and flattening of the growth rate with (pyrrolidine)$_2$Si(OMe)$_2$ pulse time
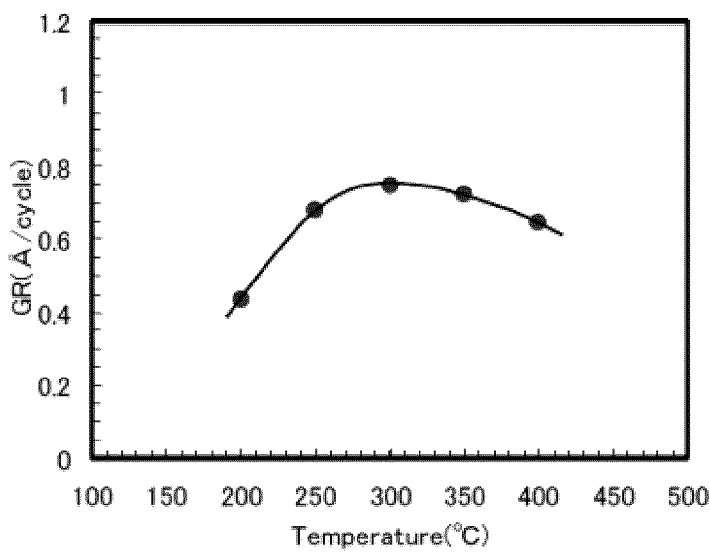
Figure 22. ALD of SiO$_2$ using (pyrrolidine)$_2$Si(OMe)$_2$ and O$_3$ carried out, showing the temperature effect on the growth rate, suggesting best ALD window is 250-400°C

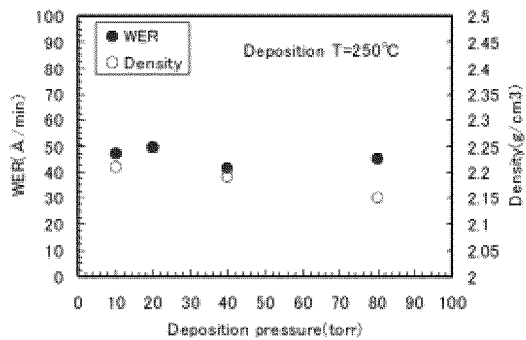
Figure 23. Wet etching rate of SiO$_2$ films in dilute HF acid (0.1%), films prepared by CVD at 250°C and various pressures using (pyrrolidine)$_2$Si(OMe)$_2$ and O$_3$
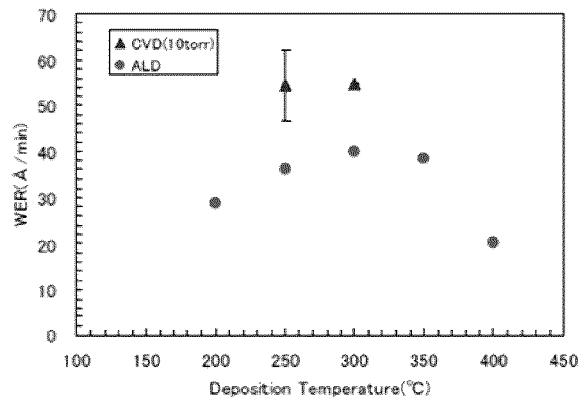
Figure 24. Wet etching rate of SiO$_2$ films in dilute HF acid (0.1%), films prepared by CVD and ALD at various temperatures using (pyrrolidine)$_2$Si(OMe)$_2$ and O$_3$

| Precursor | Oxidant | Deposition Temperature | Growth Rate (Å/cycle) | Wet Etch Rate (A/minutes in 0.5% HF) |
|---|---|---|---|---|
| Tris(dimethylamino) silane – 3DMAS | Ozone ($O_3$) | 350 °C | 0.9 | 300 |
| Bis(diethylamino) silane – BDEAS | Ozone ($O_3$) | 350 °C | 1.2 | 300 |
| Amino Silane A | Ozone ($O_3$) | 350 °C | 1.8 | 300 |
| (pyrrolodinyl)$_2$Si(OMe)$_2$ Example 2 | Ozone ($O_3$) | 350 °C | 0.7 | 200 |

Figure 25. Table showing the wet etching rate comparison of the new material with commercially available material used to carry out deposition of silicon oxide films using the same conditions

ORGANOMETALLIC COMPOUND AND METHOD

FIELD OF THE INVENTION

The invention relates to organometallic compounds which may be useful as precursors for metal oxide vapour phase deposition. The organometallic compounds of the invention comprise one or more ligands which are strong Lewis bases. The invention also relates to the low temperature vapour phase deposition of metal oxides using such compounds as a catalyst, in the presence of an oxidant.

BACKGROUND OF THE INVENTION

As the size of transistors keeps decreasing, challenges arise with the use of standard methods for the thermal deposition of $SiO_2$ and other metal oxides at high temperature. The use of high temperature causes diffusion of some elements. This diffusion changes the basic properties of transistors. Consequently, the devices are damaged. Therefore, low temperature thermal deposition of good quality $SiO_2$ and metal oxides for high k applications is preferred. However, in general, thermal (i.e. high temperature) deposition of $SiO_2$ is preferred as plasma-assisted deposition can damage the underlying device structures. Silicon dioxide ($SiO_2$) is a common dielectric material in silicon microelectronic devices. High quality $SiO_2$ has been formed by the thermal oxidation of silicon between 700-900° C. $SiO_2$ has also been deposited by chemical vapour deposition (CVD); some such approaches have utilized plasma techniques. However, CVD is not conformal in high aspect ratio structures and displays void formation in trenches and vias.

Atomic layer deposition (ALD) methods can be used to obtain conformality and atomic layer control of thin film growth. Atomic layer deposition (ALD) is a growth method based on sequential, self-limiting surface reactions. A variety of materials, including oxides, nitrides, and various metals have been deposited using ALD.

Despite its importance, $SiO_2$ ALD has been difficult to achieve. $SiO_2$ ALD using $SiCl_4$ and $H_2O$ requires high temperatures (>325° C.) and large reactant exposures (>109 L (1 L) $10^{-6}$ Torr s). The use of $NH_3$ or pyridine permits the use of temperatures close to room temperature and exposures of ~103-104 L. However, the by-products generated by these methods may cause blockage of the vacuum lines, incorporation of the amine hydrochloride salts into the films and, thus, the final quality of the films are very poor.

However, the use of halides in these methods results in the release of corrosive HCl during deposition. In addition, the HCl liberated can react with the amine catalyst to form chloride salts, leading to film contamination and thus poor film quality.

To avoid using halides, $SiO_2$ ALD has been attempted using a variety of reactants such as alkoxysilanes, aminosilanes and isocyanates, using a variety of different catalysts and reaction conditions. These methods suffer from a number of disadvantages, such as requiring large reactant exposures, long deposition times or resulting in contamination of the deposited film.

SUMMARY OF THE INVENTION

A class of organometallic compounds is provided. The compounds correspond in structure to Formula 1:

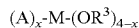

wherein:

A is selected from the group consisting of $—NR^1R^2$, $—N(R^4)(CH_2)_nN(R^5R^6)$, $—N=C(NR^4R^5)(NR^6R^7)$, $OCOR^1$, halo and Y;

$R^1$ and $R^2$ are independently selected from the group consisting of H and a cyclic or acyclic alkyl group having from 1 to 8 carbon atoms, with the proviso that at least one of $R^1$ and $R^2$ must be other than H;

$R^4$, $R^5$, $R^6$ and $R^7$ are independently selected from the group consisting of H and an acyclic alkyl group having from 1 to 4 carbon atoms;

Y is selected from the group consisting of a 3- to 13-membered heterocyclic radical containing at least one nitrogen atom;

$R^3$ is a cyclic or acyclic alkyl group having from 1 to 6 carbon atoms;

M is selected from the group consisting of Si, Ge, Sn, Ti, Zr and Hf;

x is an integer from 1 to 3; and n is an integer from 1 to 4.

Such compounds may be useful as precursors for metal oxide vapour phase deposition. The compounds of the invention comprise one or more ligands which are strong Lewis bases. Exemplary bases comprise acetates, halides and neutral, nitrogen-containing species with high proton affinity such as phosphazenes, amidines and guanidines.

These compounds may have utility as precursors for vapour deposition processes such as CVD, ALD, plasma assisted ALD and plasma assisted CVD.

BRIEF DESCRIPTION OF THE DRAWINGS

FIG. 1 is a schematic representation of an ALD system for thin film deposition.

FIG. 2 shows the NMR spectrum of (pyrrolodinyl)Si(OMe)$_3$

FIG. 3 shows the NMR spectrum of (pyrrolodinyl)$_2$Si(OMe)$_2$

FIG. 4 shows the TGA of (pyrrolodinyl)$_2$Si(OMe)$_2$

FIG. 5 shows the vapour pressure of (pynolodinyl)$_2$Si(OMe)$_2$

FIG. 6 shows the thermal stability of (pyrrolodinyl)$_2$Si(OMe)$_2$

FIG. 7 shows the NMR spectrum of (pyrrolodinyl)$_3$Si(OMe)

FIG. 8 shows the TGA of (pyrrolodinyl)$_3$Si(OMe)

FIG. 9 shows the vapour pressure of (pynolodinyl)$_3$Si(OMe)

FIG. 10 shows the NMR spectrum of (Tetramethylguanidinyl)Si(OMe)$_3$

FIG. 11 shows the NMR spectrum of (Tetramethylguanidinyl)$_2$Si(OMe)$_2$

FIG. 12 shows the NMR spectrum of (Et$_2$N)Si(OMe)$_3$

FIG. 13 shows the NMR spectrum of ClSi(OMe)$_3$

FIG. 14 shows the NMR spectrum of Cl$_2$Si(OMe)$_2$

FIG. 15 shows the NMR spectrum of (AcO)Si(OMe)$_3$

FIG. 16 shows the NMR spectrum of (Me$_2$N)$_2$Si(OMe)$_2$

FIG. 17 shows the vapour pressure of (Me$_2$N)$_2$Si(OMe)$_2$

FIG. 18 shows the thermal stability of (Me$_2$N)$_2$Si(OMe)$_2$

FIG. 19 shows the CVD growth rate vs. temperature of of $SiO_2$ using (pyrrolodinyl)$_2$Si(OMe)$_2$ and $H_2O$ at 80 Torr.

FIG. 20 shows the CVD growth rate vs. temperature and pressure of of $SiO_2$ using (pyrrolodinyl)$_2$Si(OMe)$_2$ and $O_3$.

FIG. 21 shows the ALD of $SiO_2$ using (pyrrolodinyl)$_2$Si(OMe)$_2$ and $O_3$, showing linear film thickness with number of ALD cycles.

FIG. 22 shows the ALD of $SiO_2$ using $(pyrrolodinyl)_2Si(OMe)_2$ and $O_3$, showing the temperature effect on the growth rate.

FIG. 23 shows the wet etching rate of $SiO_2$ films in dilute HF acid (0.1%), films prepared by CVD at 250° C. and various pressures using $(pyrrolodinyl)_2Si(OMe)_2$ and $O_3$.

FIG. 24 shows the wet etching rate of $SiO_2$ films in dilute HF acid (0.1%), films prepared by CVD and ALD at various temperatures using $(pyrrolodinyl)_2Si(OMe)_2$ and $O_3$.

FIG. 25 Table showing the wet etching rate comparison of the new material with commercially available material used to carry out deposition of silicon oxide films using the same conditions

DETAILED DESCRIPTION OF THE INVENTION

A class of organometallic compounds is provided. The compounds correspond in structure to Formula 1:

$$(A)_x\text{-}M\text{-}(OR^3)_{4-x}$$

wherein:

A is selected from the group consisting of $-NR^1R^2$, $-N(R^4)(CH_2)_nN(R^5R^6)$, $-N=C(NR^4R^5)(NR^6R^7)$, $OCOR^1$, halo and Y;

$R^1$ and $R^2$ are independently selected from the group consisting of H and a cyclic or acyclic alkyl group having from 1 to 8 carbon atoms, with the proviso that at least one of $R^1$ and $R^2$ must be other than H;

$R^4$, $R^5$, $R^6$ and $R^7$ are independently selected from the group consisting of H and an acyclic alkyl group having from 1 to 4 carbon atoms;

Y is selected from the group consisting of a 3- to 13-membered heterocyclic radical containing at least one nitrogen atom;

$R^3$ is a cyclic or acyclic alkyl group having from 1 to 6 carbon atoms;

M is selected from the group consisting of Si, Ge, Sn, Ti, Zr and Hf;

x is an integer from 1 to 3; and n is an integer from 1 to 4.

Such compounds may be useful as precursors for metal oxide vapour phase deposition. The compounds of the invention comprise one or more ligands which are strong Lewis bases. Exemplary bases comprise acetates, halides and neutral, nitrogen-containing species with high proton affinity such as phosphazenes, amidines and guanidines.

Strong bases catalyze the formation of $SiO_2$ much more effectively and more efficiently than a base such as $NH_3$, which is a typical example of a base used in the art. The use of a strongly basic catalyst allows for CVD and ALD deposition of $SiO_2$ at a low temperature. It also results in a good quality $SiO_2$ film.

Compounds of the invention may be useful as precursors in chemical phase deposition processes such as atomic layer deposition (ALD), chemical vapour deposition (CVD), plasma assisted ALD and plasma assisted CVD.

The use of a compound of the invention in the process outlined above has the advantage that deposition may be carried out at lower temperatures (0-500° C.) than processes previously known in the art.

The temperature range at which the reaction proceeds may be adjusted by changing the number of $(NR^1R^2)_x$ groups attached to a compound of Formula 1 (i.e. changing x), and by changing the nature of the $(NR^1R^2)$ group.

The reaction temperature may be in the range of from 0-500° C., more preferably from 100-350° C.

Incorporation of a strongly basic ligand into a compound of Formula 1 also allows for simpler process compared to processes of the art, which use two components (Si precursor plus catalyst), improving uniformity of exposure and film quality.

A compound of Formula 1 can be designed to provide desirable characteristics such as volatility and stability to facilitate application to the substrate. This can be affected by adjusting the number (x) and identity of the strongly basic ligand(s) A and of the alkyl group(s) $(OR^3)$.

Compounds of the invention include those in which M is selected from the group consisting of Si, Ge, Sn, Ti, Hf and Zr. Preferred compound include those in which M is selected from the group consisting of Si, Ge and Sn. More preferred compounds include those in which M is Si.

Compounds of the invention also include those in which $R^3$ is a cyclic or acyclic alkyl group having from 1 to 6 carbon atoms. Preferred compounds are those in which $R^3$ is a linear or branched lower alkyl group having from 1 to 4 carbon atoms. Yet other preferred compounds are those in which $R^3$ is selected from the group consisting of methyl and ethyl.

Compounds of the invention also include those in which A is selected from the group consisting of $-NR^1R^2$, $-N(R^4)(CH_2)_nN(R^5R^6)$, $-N=C(NR^4R^5)(NR^6R^7)$, $OC-OR^1$, halo and Y. Preferred compounds include those in which A is selected from the group consisting of acetate, tetraethylguanidinyl, dimethylethylenediaminyl, bromo, iodo and an $-NR^1R^2$ group. More preferred compounds include those in which A is an $-NR^1R^2$ group.

Other preferred compounds are those in which $R^1$ and $R^2$ are independently selected from the group consisting of H and a cyclic or acyclic alkyl group having from 1 to 8 carbon atoms.

More preferred compounds of the invention include those in which $R^1$ and $R^2$ are independently selected from the group consisting of an alkyl group having from 1 to 4 carbon atoms. Other referred compounds of the invention include those in which $R^1$ and $R^2$ are independently selected from the group consisting of methyl, ethyl and isobutyl.

Compounds of the invention also include those in which Y represents a 3- to 13-membered heterocyclic radical containing at least one nitrogen atom.

Preferred compounds of the invention include those in which Y is a radical such as aziridinyl, azetidinyl, pyrrolidinyl, pyrrolyl, piperidinyl, pyridinyl, azepanyl, or azepinyl.

Further compounds of the invention include those in which Y contains at least one other heteroatom, such as an oxaziridinyl, imidazolidinyl, pyrazolidinyl, oxazolidinyl, isoxazolidinyl, piperazinyl, morpholiny, imidazolyl, pyrazolyl, oxazolinyl, isoxazolyl, diazinyl, or oxazinyl radical.

Preferred compounds are those in which Y is selected from the group consisting of pyrrolidinyl, azetidinyl and aziridinyl.

Compounds of the invention also include those in which $R^4$, $R^5$, $R^6$ and $R^7$ are independently selected from the group consisting of H and an acyclic alkyl group having from 1 to 4 carbon atoms. Preferred compounds are those in which are independently selected from the group consisting of methyl and ethyl.

Compounds of the invention may be useful as precursors for thin film deposition, using methods such as ALD or CVD. For example, one way in which the deposition of $SiO_2$ films by ALD may be carried out is as follows:

a) Providing at least one substrate having functional O—H groups covering the surface, b) delivering to said substrate at least one compound of Formula 1 (wherein M=Si) in the gaseous phase,
c) purging substrate with purge gas;
d) delivering to said substrate an oxygen source in gaseous phase,
e) purging substrate with purge gas,
f) repeat steps b) through e) until a desired thickness of silicon oxide is deposited.

Suitable oxygen sources include, but are not limited to, compounds such as $H_2O$ in gaseous phase, $H_2O_2$ in gaseous phase, $O_2$, $O_3$ and hydrazine A typical schematic for an ALD system is shown in FIG. 1.

For the half cycle of precursor A reaction, an inert carrier gas (1) such as Ar is passed through manual valve (2) and mass flow controller (3) at a controlled flow rate to bubbler 1 (7) containing precursor A and carries vaporized precursor A to the reaction chamber (10). The automatic switch valves (ASV) 4 and 8 for bubbler 1 open automatically for the period of time that is pre-set. ASV 4 and 8 then close automatically, followed by purging and vacuuming of the reaction chamber for a pre-set period of time. The half cycle reaction for precursor A is finished. Automatically, ASV 13 and 17 open up, an inert carrier gas (1) such as Ar is passed through manual valve (2) and mass flow controller (3) at a controlled flow rate to bubbler 2 (15) containing precursor B and carries vaporized precursor B to the reaction chamber (10). After the pre-set period of time, ASV 13 and 17 close automatically, followed by purging and vacuuming of the reaction chamber for a pre-set period of time. The half cycle reaction for precursor B is finished. A full reaction cycle is finished, i.e. one atomic layer of product is deposited on substrate (20). The cycle is repeated to obtain the desired thickness. The temperature is controlled by a heater (18) and thermocouple (19). The pressure in the reaction chamber is controlled by pressure regulating valve (12), which is connected to vacuum pump.

Compounds of the invention may be prepared by processes known in the art. The examples below are illustrative of such processes, but are not intended to be limiting.

Example 1

Synthesis of (pyrrolodinyl)Si(OMe)$_3$

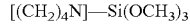
Chemical formula:

7.1 g pyrrolidine and 100 mL hexane were charged into a 250 mL flask under $N_2$, followed by the addition of 40 mL of 2.5M BuLi. After stirring for 1 hr, 15.2 g tetramethyl orthosilicate was added. After stirring overnight, the reaction mixture was filtered and a clear liquid collected. Volatiles were removed under vacuum. The obtained liquid product was then purified by distillation. NMR analysis confirmed the product, as shown in FIG. 2.

Example 2

Synthesis of (pyrrolodinyl)$_2$Si(OMe)$_2$

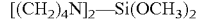
Chemical formula:

7.1 g pyrrolidine and 100 mL hexane were charged into a 250 mL flask under $N_2$, followed by the addition of 40 mL of 2.5M BuLi. After stirring for 1 hr, 7.6 g tetramethyl orthosilicate was added. After stirring overnight, the reaction mixture was filtered to collect a clear liquid. Volatiles were removed under vacuum. The obtained liquid product was then purified by distillation. NMR analysis confirmed the product, as shown in FIG. 3. As seen in FIG. 4, the TGA curve shows a stable material with minimal residue. Vapour pressure measurements shown in FIG. 5 demonstrate good volatility and FIG. 6 demonstrates the thermal stability of the compound up to 450° C.

Example 3

Synthesis of (pyrrolodinyl)$_3$Si(OMe)

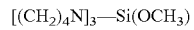
Chemical Formula:

7.1 g pyrrolidine and 100 mL hexane were charged into a 250 mL flask under $N_2$, followed by the addition of 40 mL of 2.5M BuLi. After stirring for 1 hr, 5.1 g tetramethyl orthosilicate was added. After stirring overnight, the reaction mixture was filtered to collect a clear liquid. Volatiles were removed under vacuum. The obtained liquid product was then purified by distillation. NMR analysis confirmed the product, as shown in FIG. 7. As seen in FIG. 8, the TGA curve shows a stable material with minimal residue. Vapour pressure measurements shown in FIG. 9 demonstrate good volatility.

Example 4

Synthesis of (Tetramethylguanidinyl)Si(OMe)$_3$

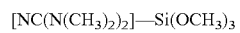
Chemical formula:

10 g Tetramethylguanidine and 100 mL hexane were charged into a 250 mL flask under $N_2$, followed by the addition of 35 mL of 2.5M BuLi. After stirring for 1 hr, 13.2 g tetramethyl orthosilicate was added. After stirring overnight, the reaction mixture was filtered to collect a clear liquid. Volatiles were removed under vacuum. The obtained liquid product was then purified by distillation. NMR analysis confirmed the product, as shown in FIG. 10.

Example 5

Synthesis of (Tetramethylguanidinyl)$_2$Si(OMe)$_2$

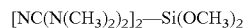
Chemical formula:

10 g Tetramethylguanidine and 100 mL hexane were charged into a 250 mL flask under $N_2$, followed by the addition of 35 mL of 2.5M BuLi. After stirring for 1 hr, 6.6 g tetramethyl orthosilicate was added. After stirring overnight, the reaction mixture was filtered to collect a clear liquid. Volatiles were removed under vacuum. The obtained liquid product was then purified by distillation. NMR analysis confirmed the product, as shown in FIG. 11.

Example 6

Synthesis of (Tetramethylguanidinyl)$_3$Si(OMe)

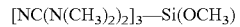
Chemical formula:

10 g Tetramethylguanidine and 100 mL hexane were charged in a 250 mL flask under $N_2$, followed by the addition of 35 mL of 2.5M BuLi. After stirring for 1 hr, 4.4 g tetramethyl orthosilicate was added. After stirring overnight, the reaction mixture was filtered to collect a clear liquid.

Volatiles were removed under vacuum. The obtained liquid product was then purified by distillation.

Example 7

Synthesis of $(Et_2N)Si(OMe)_3$

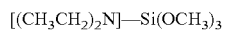
Chemical formula:

3.7 g diethylamine and 100 mL hexane were charged in a 250 mL flask under $N_2$, followed by the addition of 20 mL of 2.5M BuLi. After stirring for 1 hour, 7.6 g tetramethyl orthosilicate was added. After stirring overnight, the reaction mixture was filtered to collect a clear liquid. Volatiles were removed under vacuum. The obtained liquid product was then purified by distillation. NMR analysis confirmed the product, as shown in FIG. 12.

Example 8

Synthesis of $Cl-Si(OMe)_3$

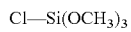
Chemical formula:

To a 250 mL flask were charged 5.1 g acetyl chloride, 7.6 g tetramethyl orthosilicate and 0.02 g aluminum trichloride, under $N_2$. The mixture was heated to reflux for 3 hours and then allowed to cool to room temperature. Volatiles were removed under vacuum. The obtained liquid product was then purified by distillation. NMR analysis confirmed the product, as shown in FIG. 13.

Example 9

Synthesis of $Cl_2-Si(OMe)_2$

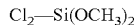
Chemical formula:

To a 250 mL flask were charged 4 g $(pyrrolodinyl)_2Si(OMe)_2$ and 50 mL diethyl ether, followed by the addition of 35 mL of 2M HCl in diethyl ether. After stirring for 1 hr the reaction mixture was filtered. Volatiles were removed from the filtrate under vacuum whilst cooling in an ice/acetone bath. NMR analysis confirmed the product, as shown in FIG. 4.

Example 10

Synthesis of $(AcO)i(OMe)_3$

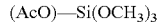
Chemical formula:

To a 100 mL flask were charged 22.8 g tetramethyl orthosilicate and 15.3 g acetic anhydride, under $N_2$. The mixture was heated at 120° C. for 4 hours and then allowed to cool to room temperature. Volatiles were removed under vacuum. Fractional distillation was then carried out to collect the desired product. NMR analysis confirmed the product, as shown in FIG. 15.

Example 11

Synthesis of $(Me_2N)_2Si(OMe)_2$

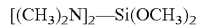
Chemical formula:

40 mL of 2.5M BuLi in hexane was charged into a 250 mL flask under $N_2$, followed by the passing of dimethylamine gas till the completion of the reaction. After stirring for 1 hr, 7.6 g tetramethyl orthosilicate was added. After stirring overnight, the reaction mixture was filtered and a clear liquid collected. Volatiles were removed under vacuum. The obtained liquid product was then purified by distillation. NMR analysis confirmed the product, as shown in FIG. 16. Vapour pressure measurements shown in FIG. 17 demonstrate very good volatility. Thermal decomposition tests carried out in sealed ampoules shown in FIG. 18 show that this material is thermally stable up to 450° C.

Example 12

$SiO_2$ Deposition Using $(pyrrolidinyl)_2Si(OMe)_2$ $SiO_2$ films have been prepared by CVD and ALD from the precursor $(pyrrolidine)_2Si(OMe)_2$ using $O_3$ or $H_2O$ as an oxidant, at various temperatures and pressures. Data has been obtained on growth rate of the $SiO_2$ films, and film quality was measured by density and wet etching rate (WER) in dilute HF acid.

Growth rates of films prepared by CVD as a function of temperature and gas pressure are shown in FIGS. 19 and 20. These show that when $H_2O$ is used as the oxidant the growth rate is relatively slow, 3 A/min or less (the scale in FIG. 19 is in nm/min which is 10 A/min). Subsequent tests used $O_3$ as the oxidizing agent, resulting in approximately ten times higher growth rates, as shown in FIG. 20. Growth rate is largely independent of deposition pressure and appears to be optimized in the 200-300° C. temperature range.

Subsequent tests measured film growth per cycle using ALD. FIG. 21 shows linear film thickness growth vs. number of cycles, and flat growth rate per cycle with increasing exposure time as expected if the single atomic layer per cycle deposition process is working correctly.

FIG. 22 illustrates the temperature dependence of the growth rate per cycle as a function of temperature indicating an optimal temperature range of 250-400° C.

Quality of the produced films was measured by measuring density and the wet etching rate in 0.1% HF acid. FIG. 23 shows the WER and density of films prepared by CVD at 250° C. and various deposition pressures. FIG. 24 compares WER for films prepared at various temperatures by CVD and ALD, showing the superior quality of ALD prepared films (lower WER is considered indicative of superior film quality).

For comparison WER for films prepared by various methods are referenced from literature. WER for Thermal SiO2 has been measured at 1.8 A/min, this is the best quality film but required high temperatures incompatible with many applications. Films prepared by plama enhanced CVD and ALD using standard precursors were measured at 60 A/min and 40 A/min respectively. These are substantially higher than the WER for ALD films demonstrated here, as shown in FIG. 25.

1. Inert carrier gas input
2. Manual valve controlling inert gas input
3. Mass flow controller controlling the inert gas input digitally
4. Automatic switch valve for input of inert carrier gas to bubbler 1
5. Manual valve on the bubbler for input of inert carrier gas
6. Manual valve on the bubbler for output of inert carrier gas containing vaporized precursor 7. Bubbler containing precursor A
8. Automatic switch valve for input of inert carrier gas containing vaporized precursor to reaction chamber
9. Automatic switch valve for removal of any residues in the line.
10. Reaction chamber
11. Automatic switch valve for removal of precursors and residues in the line
12. Pressure regulating valve to vacuum pump controlling gas pressure in reaction chamber
13. Automatic switch valve for input of inert carrier gas to bubbler 2
14. Manual valve on the bubbler for input of inert carrier gas
15. Bubbler containing precursor B
16. Manual valve on the bubbler for output of inert carrier gas containing vaporized precursor
17. Automatic switch valve for input of inert carrier gas containing vaporized precursor to reaction chamber
18. Heater
19. Thermocouple
20. Substrate

What is claimed is:

1. A method for forming a metal oxide film by an atomic layer deposition (ALD) process, the ALD method comprising the steps of:
   a. Providing at least one substrate having functional O—H groups covering the surface,
   b. delivering to said substrate at least one compound of Formula 1 in the gaseous phase:

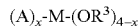
   $(A)_x\text{-M-}(OR^3)_{4-x}$ wherein:
   A is selected from the group consisting of —NMe$_2$, —N(R$^4$)(CH$_2$)$_n$N(R$^5$R$^6$), —N=C(NR$^4$R$^5$)(NR$^6$R$^7$), OCOR$^1$, and Y;
   R$^1$ is independently selected from the group consisting of a cyclic or acyclic alkyl group having from 1 to 8 carbon atoms;
   R$^4$, R$^5$, R$^6$ and R$^7$ are independently selected from the group consisting of H and an acyclic alkyl group having from 1 to 4 carbon atoms;
   Y is selected from the group consisting of a 3- to 13-membered heterocyclic radical containing at least one nitrogen atom;
   R$^3$ is a cyclic or acyclic alkyl group having from 1 to 6 carbon atoms;
   M is selected from the group consisting of Si, Ge, Sn;
   x is an integer from 1 to 3; and
   n is an integer from 1 to 4;
   with the proviso that the compound of Formula 1 is not diacetoxy-ditbutoxysilane, and
   with the proviso that when A is —NMe$_2$, R$^3$ is methyl or ethyl,
   c. purging the substrate with purge gas,
   d. delivering to said substrate an oxygen source in the gaseous phase,
   e. purging the substrate with purge gas,
   f. repeating steps b) through e) until a desired thickness of metal oxide has been deposited.

2. The method of claim 1, wherein M is Si.
3. The method of claim 1, wherein A is selected from the group consisting of acetate, tetraethylguanidinyl, dimethylethylenediaminyl, and Y.
4. The method of claim 1, wherein A is OCOR$^1$, and wherein R$^1$ is independently selected from the group consisting of an acyclic alkyl group having from 1 to 4 carbon atoms.
5. The method of claim 3, wherein A is Y, and wherein Y is selected from the group consisting of aziridinyl, azetidinyl, pyrrolidinyl, pyrrolyl, piperidinyl, pyridinyl, azepanyl, and azepinyl.
6. The method of claim 1, wherein R$^3$ is an acyclic alkyl group having from 1 to 4 carbon atoms.
7. The method of claim 3 wherein A is pyrrolidinyl, and R$^3$ is selected from the group consisting of methyl and ethyl.
8. The method of claim 1, wherein the oxygen source is selected from H$_2$O in gaseous phase, H$_2$O$_2$ in gaseous phase, O$_2$, O$_3$ and hydrazine.
9. The method of claim 1, wherein A is —NMe$_2$.
10. The method of claim 4, wherein R$^1$ is independently selected from the group consisting of methyl, ethyl and isobutyl.
11. The method of claim 5, wherein Y is selected from the group consisting of aziridinyl, azetidinyl and pyrrolidinyl.
12. The method of claim 6, wherein R$^3$ is selected from the group consisting of methyl and ethyl.
13. The method of claim 12, wherein R$^3$ is a methyl group.
14. The method of claim 1, wherein A is —N(R$^4$)(CH$_2$)$_n$N(R$^5$R$^6$) or —N=C(NR$^4$R$^5$)(NR$^6$R$^7$).
15. The method of claim 14, wherein R$^4$, R$^5$, R$^6$ and R$^7$ are independently selected from the group consisting of methyl and ethyl.

* * * * *